United States Patent [19]

Chapman

[11] 4,206,414

[45] * Jun. 3, 1980

[54] ELECTRICAL SYNCHRONIZING CIRCUITS

[75] Inventor: Robert A. Chapman, Newbury, England

[73] Assignee: Racal Group Services Limited, England

[*] Notice: The portion of the term of this patent subsequent to Dec. 26, 1995, has been disclaimed.

[21] Appl. No.: 948,423

[22] Filed: Oct. 4, 1978

Related U.S. Application Data

[63] Continuation of Ser. No. 826,838, Aug. 22, 1977, Pat. No. 4,131,856.

[30] Foreign Application Priority Data

Sep. 1, 1976 [GB] United Kingdom ............... 36129/76

[51] Int. Cl.² .......................... H03B 3/04; H04L 7/02
[52] U.S. Cl. ........................... 328/155; 328/55; 328/72; 328/133; 324/83 A; 324/83 D
[58] Field of Search ............... 328/133, 134, 55, 155, 328/72; 324/83 A, 83 D

[56] References Cited

U.S. PATENT DOCUMENTS

| 3,588,710 | 6/1971 | Masters ............................ 328/133 |
| 3,728,635 | 4/1973 | Eisenberg ......................... 328/55 |
| 3,755,748 | 8/1973 | Larlow et al. .................... 328/155 |
| 3,895,294 | 7/1975 | Vinding ............................ 324/83 D |

FOREIGN PATENT DOCUMENTS 1301598  12/1972  United Kingdom ..................... 328/155

Primary Examiner—John S. Heyman
Attorney, Agent, or Firm—Larson, Taylor and Hinds

[57] ABSTRACT

There is disclosed an electrical circuit arrangement for phase-synchronizing a first pulse train with a second pulse train, in which the algebraic phase difference between each pulse of one pulse train and the next pulse of the other pulse train is measured for each of a predetermined number of pulses of one of the pulse trains. The algebraic average phase difference is then determined over the said predetermined number of pulses, and the absolute phase of the pulses of the first pulse train is then adjusted in correspondence with the average phase difference so as to bring the two pulse trains closer into phase equality.

8 Claims, 4 Drawing Figures

ELECTRICAL SYNCHRONIZING CIRCUITS

This is a continuation of application Ser. No. 826,838, filed Aug. 22, 1977, (now U.S. Pat. No. 4,131,856, issued Dec. 26, 1978).

BACKGROUND OF THE INVENTION

The invention relates to electrical circuit arrangements and more particularly to electrical circuit arrangements for synchronising electrical signals such as trains of data pulses.

A requirement often exists for synchronising two pulse trains. For example, it may be desirable to produce in a receiver a train of pulses which are synchronised with the bit rate of data received over a transmission link. Even though normally the bit rate will be nominally constant, it is necessary to make adjustments from time to time in the phase of a pulse train generated in the receiver—to take account of inevitable drift and other similar factors. It is known to transmit a synchronising signal over such a transmission link for carrying out this phase adjustment but this is wasteful of transmission capacity.

Furthermore, a system which periodically measures the phase difference between a pulse train at a receiver and the bit rate of the received signal and simply produces a correction dependent on this phase difference may not be completely satisfactory, because the phase difference measured at that instant may not be representative of the phase difference at other times.

BRIEF SUMMARY OF THE INVENTION

According to the invention, there is provided an electrical circuit arrangement for phase-synchronising a first pulse train with a second pulse train, comprising phase difference measuring means operative during each of a predetermined number of periods of one of the pulse trains to measure the algebraic phase difference between the pulses of the two pulse trains, averaging means for determining the algebraic average of the phase differences over the said predetermined number of periods, and phase adjusting means operative to adjust the absolute phase of the pulses of the first pulse train in correspondence with the said algebraic average of the phase differences so as to bring the two pulse trains closer into phase equality.

According to the invention, there is also provided a circuit arrangement for tending to synchronise a first pulse train with a second pulse train of nominally the same frequency, comprising means for generating a third pulse train whose frequency is a multiple of the first pulse train, a counter connected to receive and count the third pulse train so as to divide the frequency thereof by its maximum count and thereby produce the pulses of the first pulse train, detecting means for detecting the actual count of the counter at the instant when each pulse of the second pulse train occurs and is separated from a preceding pulse of that train by a pulse of the first train and for detecting the complement of the actual count of the counter at the instant when each pulse of the second pulse train occurs and is not separated from a preceding pulse of that train by a pulse of the first train, means for algebraically accumulating the detected counts for each of a predetermined number of the pulses of the second pulse train with each detected actual count being considered to be of one sign and each detected complement count being considered to be of the opposite sign, means operative on the occurrence of the last of the said predetermined number of pulses of the second pulse train to measure the average of the accumulated counts and to produce a control signal having a value dependent thereon, and means responsive to this control signal for instantaneously altering the count of the counter so as to phase-displace the pulses of the first pulse train emitted therefrom in a direction tending to synchronise them with the pulses of the second pulse train.

According to the invention, there is further provided an electrical circuit arrangement for tending to synchronise a first pulse train with a second pulse train of nominally the same frequency, comprising means for generating a third pulse train whose frequency is a multiple of the first pulse train, a resettable divider connected to receive the third pulse train and dividing the frequency thereof so as to produce the pulses of the first pulse train, a ramp generator initiated in response to each pulse of the first pulse train to commence substantially linear ramping from a predetermined voltage level lying on one side of a datum voltage and passing through the datum voltage to the other side thereof until re-initiated, means responsive to each pulse of the second pulse train for momentarily sampling the amplitude at that time of the ramp voltage, means for algebraically integrating M samples, where M is a predetermined number, comparing means operative in response to the occurrence of the last of M pulses of the second pulse train to compare the output of the integrating means with the level of the ramp voltage and to produce a control signal when the ramp voltage level next corresponds to the output of the integrator means, and means responsive to the control signal to reset the resettable divider so as immediately to produce the next pulse of the first pulse train.

According to the invention, there is yet further provided a method of phase-synchronising a first pulse train with a second pulse train, in which for each of a predetermined number of periods of one of the pulse trains the algebraic phase difference between the pulses of the two pulse trains is measured, the algebraic average of the phase difference is determined over the said predetermined number of periods, and the absolute phase of the pulses of the first pulse train is then adjusted in correspondence with said average phase displacement so as to bring the two pulse trains closer into phase equality.

BRIEF DESCRIPTION OF THE DRAWINGS

Data synchronising circuit arrangements embodying the invention will now be described, by way of example only, with reference to the accompanying diagrammatic drawings in which.

DESCRIPTION OF THE PREFERRED EMBODIMENTS

Figure 1:
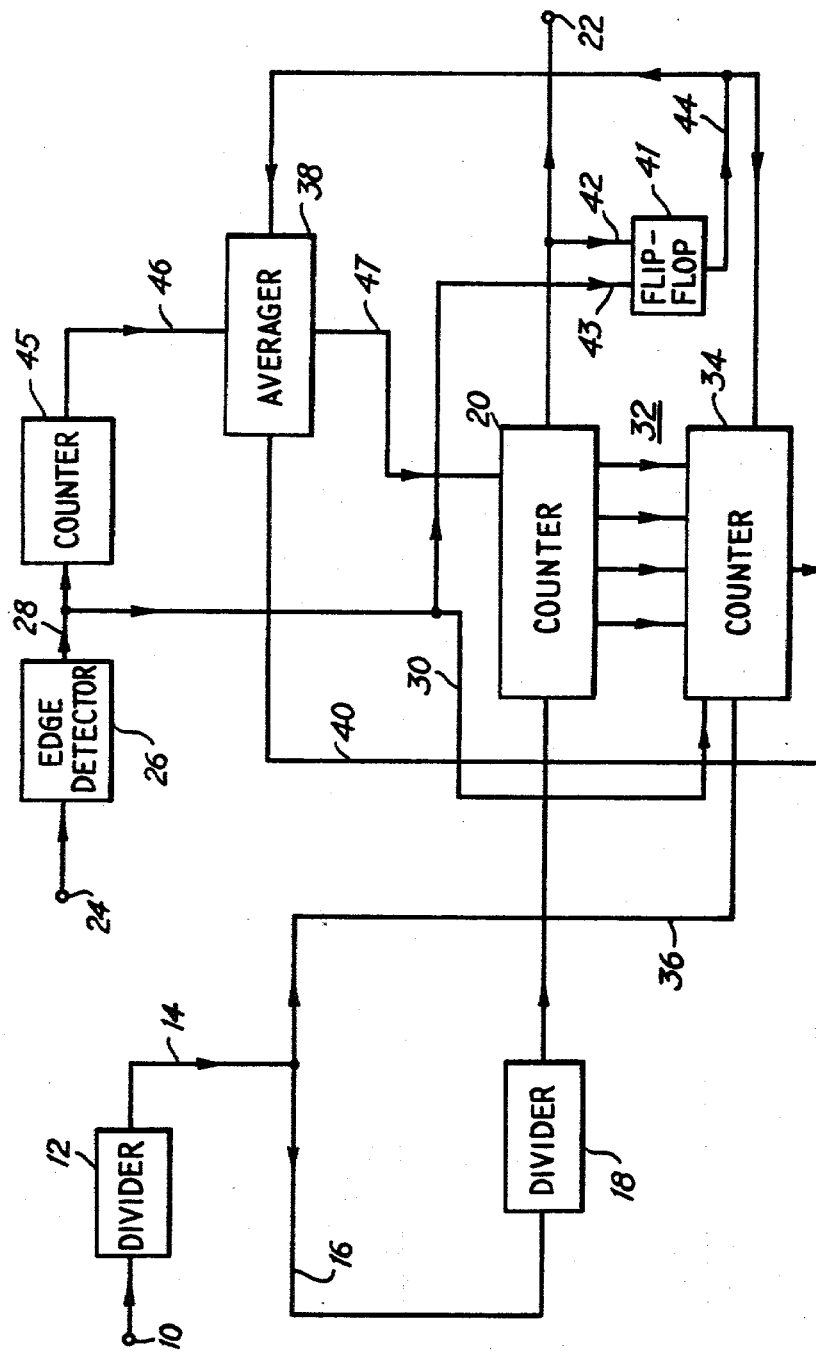
FIG. 1 is a block diagram of one of the circuit arrangements, operating digitally.

The circuit arrangement of FIG. 1 is intended to synchronise a train of pulses A1 (FIG. 2) with a train of pulses B. Pulses B may, for example, be the edges of digital data pulses received over a transmission link, and the train of pulses A1 may be pulses which are generated in a receiver (receiving the data from which the pulses B are derived). The pulses A1 have nominally the same frequency as the pulses B.

Referring more specifically to FIG. 1, high frequency pulses are generated in a crystal oscillator (not shown) and applied to an input terminal 10 which feeds them to a first frequency divider 12. The divided pulses are then fed by means of a line 14 and a line 16 to a further frequency divider 18. From the divider 18, the pulses emerge at a frequency A2 (see FIG. 2), and are fed to a recirculating resettable counter 20 acting as another divider. The finally divided output pulses, at the frequency A1, therefore appear at a terminal 22.

The data from which the pulses B are to be derived is fed via a terminal 24 to an edge detector 26 which therefore produces the train of pulses B on an output line 28.

In operation, the pulses A2 are fed into the counter 20 and count up the counter. When each pulse B occurs, it is fed as a control signal to a counter 34 on a line 30 and causes the count of the counter 20 to be transferred, in parallel, by means of lines 32, to the counter 34. The contents of the counter 34 are then rapidly read out of the counter by means of read pulses which are fed to the counter 34 by means of a line 36. The pulses on the line 36 have a substantially higher frequency than the pulses A2. The pulses read out of the counter 34 are fed into a counter 38 by means of a line 40. This process is repeated in response to the arrival of each pulse B, and the result is, therefore, that the counter 38 accumulates the sum of the number of pulses A2 by which each pulse B is displaced in time from each pulse A1.

Figure 2:
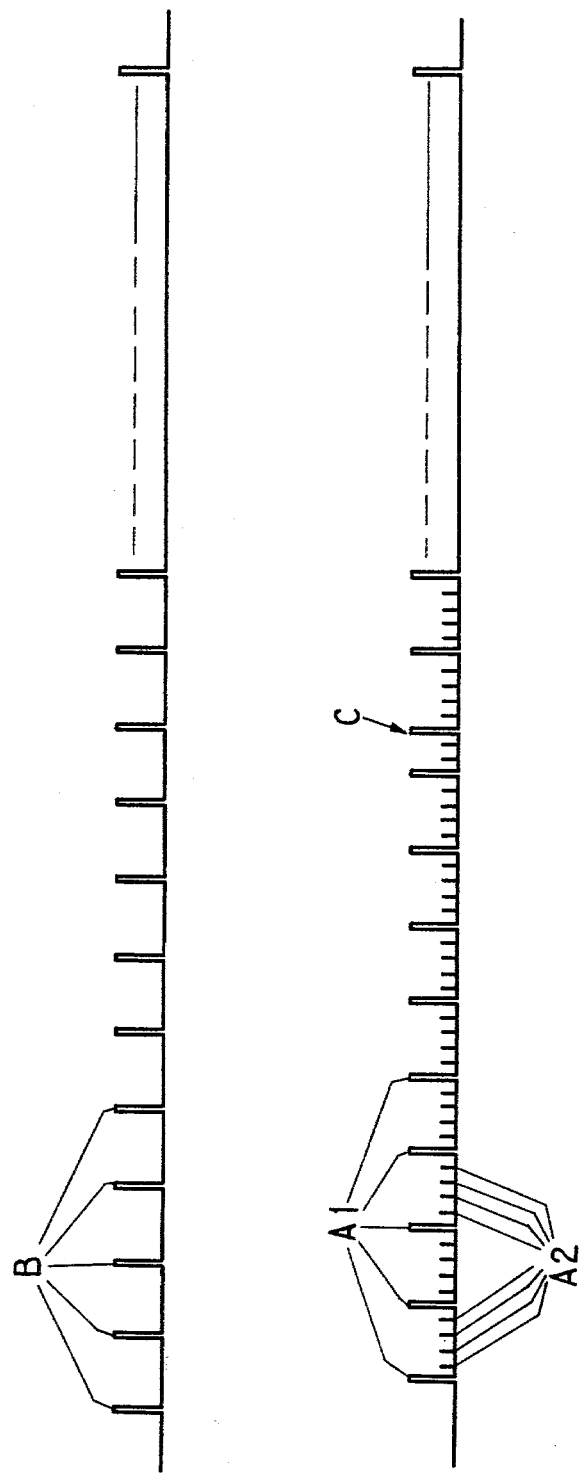
FIG. 2 shows waveforms occurring in the circuit arrangement of FIG. 1.

In FIG. 2, the two pulse trains have been drawn so that there is, over the first eight periods of the pulses A1, a constant phase difference between the pulses A1 and B. However, in practice this would not necessarily be so-due to such effects as noise and differences in the nominally identical frequencies of the pulses A1 and B. In fact, it is possible for the phase difference between the pulse trains B and A1 to become such that a pulse B becomes so displaced relative to the pulse train A1 that it leads instead of lags behind its corresponding pulse A1. In such a case, the phase difference (as measured by the count of the counter 34 when the pulse B occurs) must be treated as negative. In order to ensure this, a flip-flop circuit 41 is provided which is connected to be switched into a first state in response to each pulse A1 by means of a line 42 and into the second state in response to each pulse B by means of a line 43. The state of the flip-flop 41 is monitored by a line 44 which is connected to the counters 34 and 38 to control them to count up or down in dependence on the state of the flip-flop. Thus, in response to each pulse A1, the flip-flop 41 switches each counter 34 and 38 to count up and, on the occurrence of the next pulse B, the counters therefore count up and the counts are entered as positive. However, each pulse B also switches the state of the flip-flop (after a delay to allow the count of the counter 38 to be read out first) and the counters 34 and 38 therefore become set to count down. If a second pulse B occurs before the next pulse A1, the effect is that the count which is transferred to the counter 34 is counted down into the counter 38 and is therefore entered in the negative sense.

At the end of the eighth period of the pulses B, a pulse counter 45 produces a control pulse output on a line 46 which causes the counter 38 to divide its count by 8, thereby producing an algebraic average count which is representative of the average displacement, over the previous eight periods, between the pulse train B and the pulse train A1. This average count is fed as a control signal on a line 47 to the counter 20 and adjusts the count of that counter by a corresponding number so as effectively to instantaneously shift the next pulse A1 by a corresponding amount. In FIG. 2, this is shown to have occurred at point C. In that example, because there has previously been assumed to be a constant displacement between the pulse trains B and A1, the instantaneous shift at point C brings the pulse train A1 into exact phase with the pulse train B. Obviously, however, if the differences between the two pulse trains have not been constant over the previous eight periods, as they will in general not be, then the instantaneous shift of the count of the counter 20 will not necessarily bring the pulse train A1 into exact phase with the pulse train B, even though there will of course be a substantial improvement in synchronisation.

The process then repeats over the following eight periods of the pulse train B, and the effect is that the relative phases of the pulse trains B and A1 are regularly adjusted so as to maintain them in close synchronisation, and the pulses A1 are output at the terminal 22.

The resolution of the degree to which the phases of the pulse trains B and A1 become matched depends on the frequency of the pulses A2, and improved resolution can be achieved by increasing this frequency. However, this of course involves increasing the capacity of the counters.

It will be appreciated that the number of periods (eight in the example given) of the pulse train B over which the average divergence is measured can be selected to have any suitable value. Moreover, the circuit arrangement may be modified, if desired, so as to adjust this number in dependence on the magnitude of the average difference count (as output on line 47) over the previous periods. Thus, for example, the circuit arrangement could be designed so that, in the event of the average count being below a predetermined level, the number of periods of pulse train B over which the next average would be taken would be increased, and vice versa.

Figure 3:
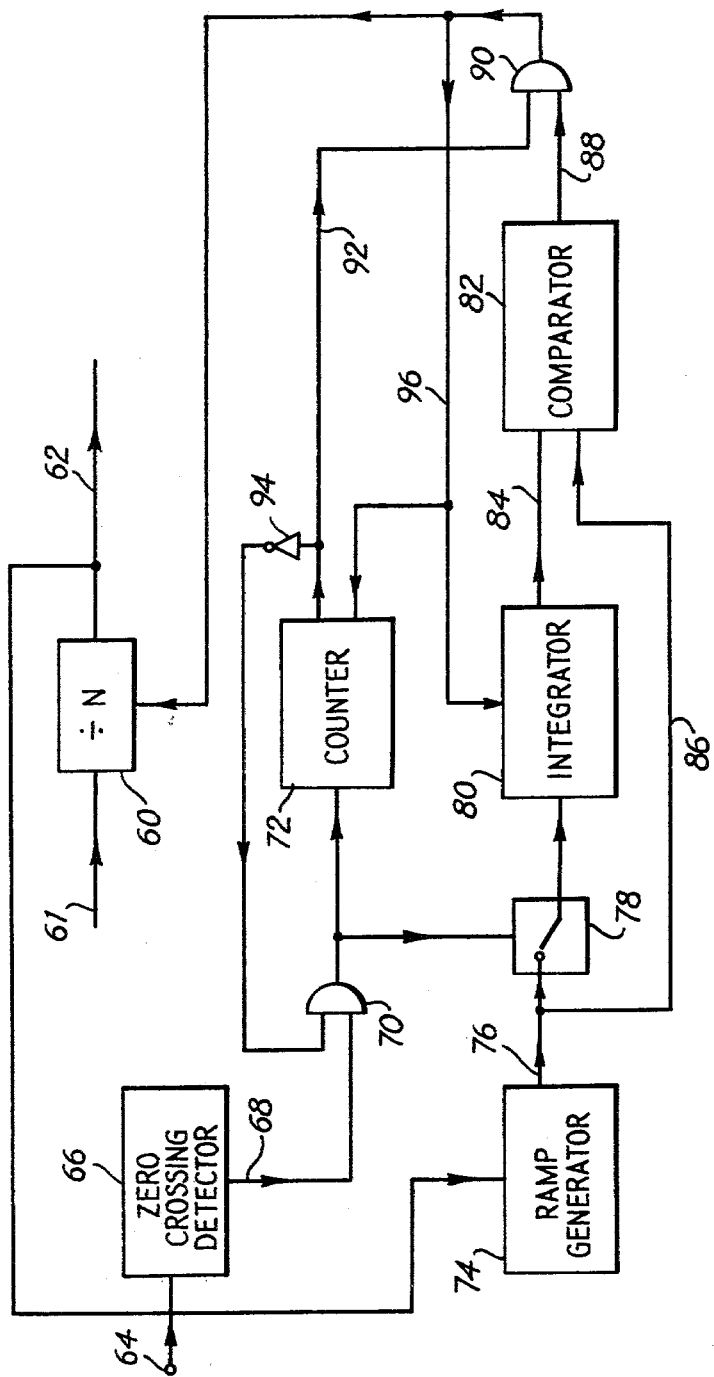
FIG. 3 is a block diagram of another of the circuit arrangements operating with analogue signals.
Figure 4:
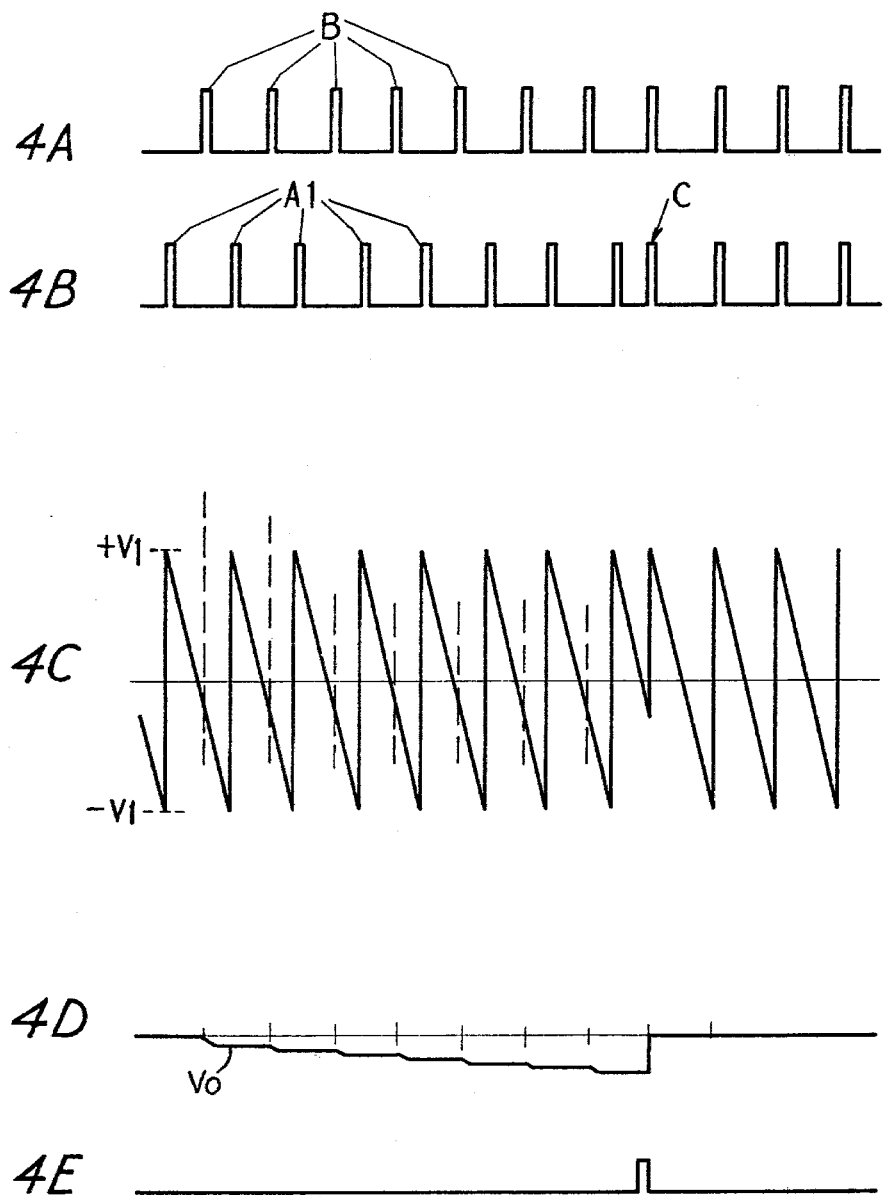
FIG. 4 shows waveforms occurring in the circuit arrangement of FIG. 3.

FIGS. 3 and 4 show a form of the circuit arrangement in which the signals are handled in analogue fashion, instead of digital fashion. FIG. 4B shows the train of pulses A1 which are to be synchronised with the train of pulses B of FIG. 4A. As before, the pulses B may, for example, be the edges of digital data pulses received over a transmission link, and the train of pulses A1 may be pulses which are generated in a receiver receiving the data from which the pulses B are derived, and again the pulses A1 have nominally the same frequency as the pulses B.

As shown in FIG. 3, the circuit arrangement comprises a source (not shown) of clock pulses having a frequency which is N times the nominal frequency of the pulses A1, and these pulses are fed into a resettable divide-by-N divider 60 on a line 61, and the resultant pulses A1 are output on a line 62.

The incoming data from which the pulses B are to be derived is fed via a terminal 64 to a zero crossing detector 66 for detecting the leading edges of the data, and the detector 64 therefore produces the train of pulses B on an output line 68. These pulses are fed through a gate 70 to a counter 72 which thus counts the pulses.

Counter 72 is arranged to be clocked on the trailing edge of each pulse B passing through the gate 70.

The pulses A1 from the divider 60 control a ramp generator 74 so that the ramp produced, on a line 76, has the same frequency as the pulses A1. The ramp starts from a voltage +V and ramps down progressively to a voltage −V, and its waveform is shown in FIG. 4C. Line 76 is connected to an electronic switch 78 and thence to an integrator 80. The integrated output, Vo, of the integrator 80 is fed to one input of a comparator 82 by means of a line 84. The second input of the comparator 82 receives the direct output of the ramp generator 74 by means of a line 86.

The electronic switch 78 is connected to be closed by each pulse B passing through gate 70.

The integrator 80 includes a potential divider circuit at its input so that it integrates over M input signals where M is an integer to be specified later.

The comparator 82 produces an output signal on a line 88 when the levels on its two input lines 84 and 86 become equal, and this output is fed via a gate 90 as a reset input to the divider 60, the counter 72, and the integrator 80.

The second input to the gate 90 is fed from the counter 72 on a line 92 and occurs when the count of the counter 72 attains the preselected integral value M. In addition, the signal on the line 92 is fed via an inverter 94 as the control signal for the gate 70.

The operation of the circuit arrangement of FIG. 3 will now be described.

As shown in FIG. 4, pulses A1 are assumed initially not to be synchronised with the pulses B, and this means that the ramp waveform of FIG. 4C is not synchronised with the pulses B either.

As each pulse B occurs, switch 78 is momentarily closed and samples the level V1 of the ramp at that instant and feeds that level into the integrator 80. The level that is fed into the integrator, in response to each pulse B, therefore depends on the instantaneous level of the ramp at that instant, and is therefore a measure of the phase divergence between the pulses B and the pulses A1. The output Vo of the integrator 80 is therefore dependent on the phase divergences between each pulse B and the corresponding pulse A1 since the integrator was last reset, and FIG. 4D shows the waveform Vo. In other words, after M cycles, the level Vo is the algebraic average of the ramp levels, during those cycles, at which the pulses B respectively occurred and therefore represents the algebraic average phase difference between the pulses A1 and the pulses B.

After M pulses B (as before, M may be 8) have occurred, counter 72 produces an output on line 92 and this opens the gate 90. When the actual level of the ramp produced by the ramp generator 74 corresponds to Vo, thus indicating that the ramp has reached that value which corresponds to the average of the levels over the previous cycles at which the pulses B have occurred, comparator 82 produces an output pulse C (FIG. 4E) on line 88 which passes through the gate 90 and resets the divider 60 so as to cause a phase shift of the pulses A1 to bring them into synchronism with the detected average frequency of the pulses B—as shown at point C in FIG. 4B.

At the same time, the pulse from the gate 90 resets the counter 72 and the integrator 80 by means of a line 96, and the process described then repeats.

As before, the circuit arrangement does not necessarily bring the pulses A1 into exact synchronism with the pulses B—because this depends on the pattern of the phase difference between the pulses B and A1 over the preceding cycles. Nevertheless there will of course be a substantial improvement in synchronisation.

Gate 70 and inverter 94 are provided to ensure that any pulse B that may occur while the gate 90 is open and the comparator 82 is waiting to detect equality between the levels on its input lines 84 and 86 cannot interfere with the comparing process; such interference is prevented because the gate 70 becomes closed as soon as counter 72 produces its output on line 92, and therefore any pulse B which may occur thereafter (and until the counter 72 is reset) is blocked.

Each pulse B, and each control pulse C, is short compared with the period of the pulses A1.

The comparator 82 is arranged not to produce an output during the flyback of the ramp.

FIGS. 1 and 3 show merely examples of various possible circuits. It will also be appreciated that the functions carried out by the circuitry illustrated can instead be carried out by an appropriately programmed microprocessor.

It will also be appreciated that although for the purpose of discussion, the incoming data has been considered as a regular stream of reversal digits (i.e. 101010 . . . ), a random digit stream producing an irregular stream of pulses B will also be synchronised, as the phase measuring circuits will only operate when a transition occurs. The correction will occur after eight (or whatever number has been selected) data transitions have taken place.

What is claimed is:

1. An electrical circuit arrangement for phase-synchronising a first pulse train with a second pulse train, comprising
   phase difference measuring means connected to respond to both said pulse trains and operative during each of a predetermined number of periods of one of the pulse trains to measure the algebraic phase difference between the pulses of the two pulse trains,
   averaging means connected to the phase difference measuring means for determining the algebraic average of the phase differences over the said predetermined number of periods, and
   phase adjusting means operative in response to the averaging means at the completion of the said predetermined number of periods to adjust the absolute phase of the pulses of the first pulse train in correspondence with the said algebraic average of the phase differences so as to bring the two pulse trains closer into phase-synchronisation but maintaining the said absolute phase unadjusted at other times.

2. A circuit arrangement according to claim 1, in which the phase difference measuring means comprises
   means responsive to the pulses of the other pulse train to produce timing pulses at a predetermined multiple of the frequency thereof, and
   recirculating counting means connected to receive the timing pulses and responsive to each pulse of the said one pulse train to produce a count representing the number of timing pulses between that pulse of the said one pulse train and either the next preceding pulse of the said other pulse train or the next succeeding pulse thereof according to whether or not the pulse of the said one train is separated from the next preceding pulse thereof by a pulse of the said other train.

3. A circuit arrangement according to claim 2, in which the averaging means comprises accumulating means connected to receive and algebraically accumulate the sum of the said counts with each count being considered to be positive or negative according as to whether it represents the number of timing pulses between a pulse of the said one pulse train and the preceding or succeeding pulse of the other train, means producing a control signal in response to occurrence of a predetermined number of pulses of the said one pulse train corresponding to the said predetermined number of periods thereof, and means responsive to the said control signal to divide the accumulated algebraic sum by the said predetermined number.

4. A circuit arrangement according to claim 3, in which the phase adjusting means comprises means responsive to the divided accumulated sum to cause a substantially instantaneous phase displacement of the first pulse train by an amount corresponding to the divided accumulated sum and to reset the counting means and the accumulating means.

5. A circuit arrangement according to claim 1, in which the phase difference measuring means comprises means responsive to each pulse of the said other pulse train for initiating a ramp voltage at a predetermined voltage level on one side of a datum voltage to run progressively therefrom and through the datum voltage level to the other side thereof until re-initiated, and means responsive to each pulse of said one pulse train for sampling at that time the instantaneous voltage of the ramp relative to the datum voltage.

6. A circuit arrangement according to claim 5, in which the averaging means comprises integrating means connected to receive the sampled voltages and to integrate M samples of voltage where M is the said predetermined number, and to produce an output representing that integral.

7. A circuit arrangement according to claim 6, in which the phase adjusting means comprises means connected to count the pulses of the said one pulse train and for producing a first control signal when the predetermined number thereof has occurred, means connected to the integrating means and responsive to the first control signal to produce a second control signal at the instant when the actual level of the ramp next corresponds to the output of the integrating means, and means responsive to the second control signal to phase-displace the first pulse train so that the next pulse thereof occurs substantially at that instant.

8. A circuit arrangement according to claim 1, including means for varying the said predetermined number in dependence on the value of the said algebraic average of the phase differences.

* * * * *